United States Patent [19]

Igarashi

[11] 4,306,311

[45] Dec. 15, 1981

[54] DOUBLE-BALANCED MIXER CIRCUIT

[75] Inventor: Sadao Igarashi, Soma, Japan

[73] Assignee: Alps Electric Co., Ltd., Tokyo, Japan

[21] Appl. No.: 53,805

[22] Filed: Jul. 2, 1979

[30] Foreign Application Priority Data

Jul. 4, 1978 [JP] Japan .................................. 53-81135

[51] Int. Cl.³ .............................................. H04B 1/26
[52] U.S. Cl. ..................................... 455/327; 455/330
[58] Field of Search ............................... 455/325–328, 455/330–332; 333/120, 204, 238, 246, 26; 332/43 B

[56] References Cited

U.S. PATENT DOCUMENTS

| | | | |
|---|---|---|---|
| 3,492,603 | 1/1970 | Fredrick, Jr. ........................ | 455/326 |
| 3,629,729 | 12/1971 | Hessler, Jr. ......................... | 455/331 |
| 3,772,599 | 11/1973 | Ernst et al. ......................... | 455/325 |

OTHER PUBLICATIONS

"Broadband Double Balanced Mixer/Modulators" by Mouw et al., The Microwave Journal, pp. 131–134, 3/1969.

*Primary Examiner*—Jin F. Ng
*Attorney, Agent, or Firm*—Guy W. Shoup; Gerard F. Dunne

[57] ABSTRACT

A double-balanced mixer circuit includes a diode ring, wherein each side of the diode ring is provided with a stripline to bypass high frequency signals.

15 Claims, 5 Drawing Figures

DOUBLE-BALANCED MIXER CIRCUIT

BACKGROUND OF THE INVENTION

The present invention relates to double-balanced diode mixer circuits, and more particularly, to such mixer circuits suitable for use in the microwave frequency range.

Double-balanced diode mixer circuits are known and recently means have been proposed for obtaining excellent cross modulation characteristics by applying a self-bias to the mixer diodes in a manner utilizing the locally generated signals.

With these circuits, good characteristics can be obtained for the signals of relatively low frequencies, for example, for signals of frequencies lower than 1000 MHz. The characteristics, however, are degraded when even one of the signals to be treated has a frequency of several thousand MHz. Namely, the signals passing through the mixer diodes are attenuated by the stray capacitance or inductance in the circuit, whereby cross modulation characteristics, NF characteristics and intermodulation characteristics of the circuit are degraded. Therefore, it has been desired to improve such defects.

SUMMARY OF THE INVENTION

A principal object of the present invention therefore is to provide a double-balanced diode mixer circuit which is capable of maintaining good characteristics even for signals having frequencies of several thousand MHz.

Another object of the present invention is to provide a double-balanced diode mixer circuit which is capable of passing signals having frequencies of several thousand MHz into mixer diodes without losses.

A further object of the present invention is to provide a double-balanced diode mixer circuit which exhibits excellent cross modulation characteristics, NF characteristics and intermodulation characteristics by suitably applying a self-bias to the mixer diodes.

According to the present invention, such desirable effects are achieved by adding striplines to respective sides of a diode ring for bypassing signals of a predetermined frequency.

DESCRIPTION OF THE PREFERRED EMBODIMENTS

Prior to illustrating the preferred embodiments of the present invention, below is first mentioned a conventional circuit with reference to FIG. 1.

Figure 1:
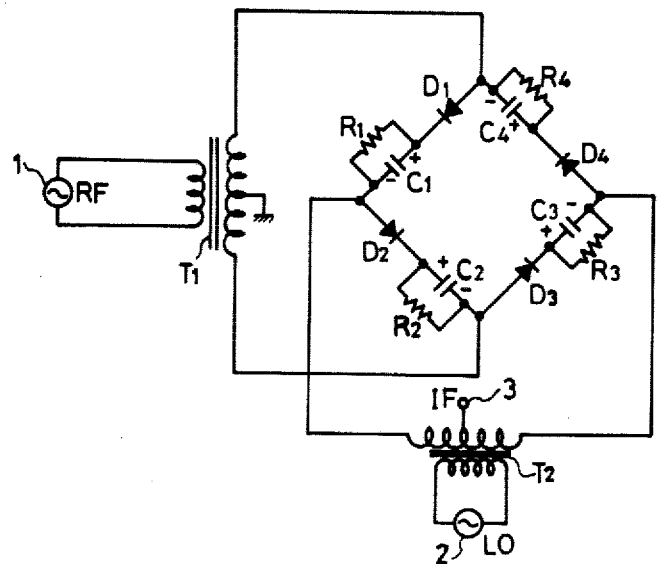
FIG. 1 is a circuit diagram showing a conventional double-balance mixer circuit.

FIG. 1 shows a known double-balanced mixer circuit having a source of RF signals 1, a source of local signals 2, and an output port 3 for the intermediate frequency (IF) signals. A first balanced transformer $T_1$ is used to introduce to RF signals to the mixer, and a second balanced transformer $T_2$ is used for introducing the signals generated locally. Symbols $D_1$ to $D_4$ designate first to fourth mixer diodes arranged in a ring, $R_1$ to $R_4$ signify first to fourth resistors, and $C_1$ to $C_4$ denote first to fourth capacitors for storing electric charges comprised of DC components of the locally generated signals for applying a reverse bias to the diodes $D_1$ to $D_4$ in order to permit the RF signals to pass through.

As is well known, the signals and the locally generated RF signals are applied in a balanced manner via the balanced transformers $T_1$ and $T_2$ to the diodes $D_1$ to $D_4$ in a manner so that signals of a frequency equal to the sum or difference of the locally generated signals and RF signals are obtained, i.e., IF signals are obtained at the IF port 3. More specifically, the locally generated signals flow through mixer diodes $D_1$ to $D_4$, whereby a voltage of a polarity indicated by (+) and (−) in the drawing is produced across the ends of each of the capacitors $C_1$ to $C_4$. Due to this voltage produced across the capacitors, the diodes $D_1$ to $D_4$ are reversely biased. The resistors $R_1$ to $R_4$ function to discharge the electric charges stored in the capacitors $C_1$ to $C_4$. By adjusting these resistances, the voltages developed across the ends of each of the capacitors $C_1$ to $C_4$ can be set so that the optimum characteristics of cross modulation are attained.

The abovementioned circuit has been known since 1976. With the above circuit, however, certain characteristics are degraded if any one of the frequencies to be treated exceeds 1000 MHz. The cause of this degradation is attributed to the stray capacitances arising among the capacitors $C_1$ to $C_4$, the resistors $R_1$ to $R_4$ and ground, and the lead inductances of the capacitors $C_1$ to $C_4$ and diodes $D_1$ to $D_4$. These stray capacitances and inductances hinder high frequency signals from flowing through the mixer diodes $D_1$ to $D_4$. If the electric current flowing through the diodes $D_1$ to $D_4$ is reduced, current values flowing through each of the diodes are conspicuously dispersed, causing the intermodulation characteristics to be degraded. Further, the decrease in voltage across the ends of each of the capacitors $C_1$ to $C_4$ makes it difficult to set optimum biasing voltages for the diodes $D_1$ to $D_4$, causing the cross modulation characteristics to be degraded, and presenting increased conversion losses so that NF characteristics of the mixer circuit are eventually degraded.

To reduce the abovementioned defects, the output of the source signals may be increased. In such event, however, expensive active elements would be necessary, and the likely occurrence of undesirable radiation makes it difficult to produce a practical circuit.

According to the present invention, respective striplines or microstrips for bypassing high frequency signals are provided for each of the sides of the diode ring, in order to reduce the abovementioned deficiencies substantially. Preferred embodiments of the invention are described below in conjunction with FIG. 2 to FIG. 5.

Figure 2:
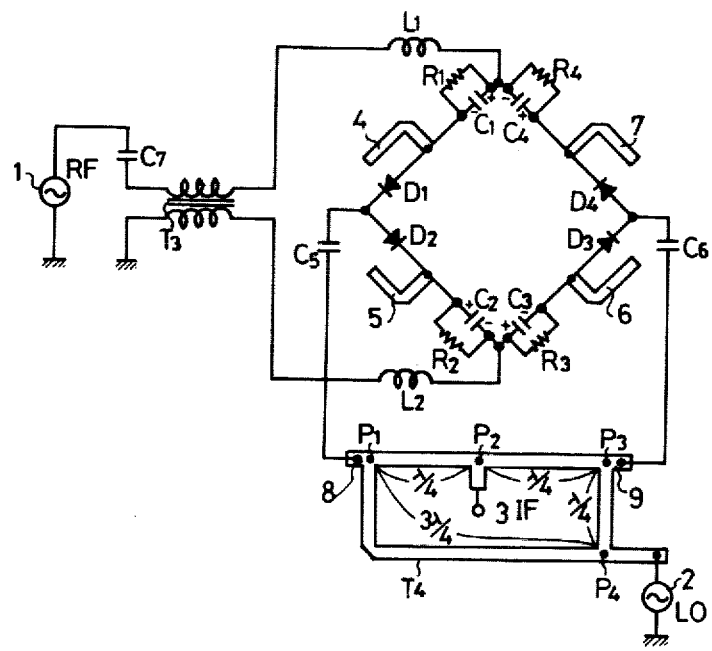
FIG. 2 is a circuit diagram showing a double-balanced mixer circuit according to one embodiment of the present invention.

FIG. 2 is a diagram showing a double-balanced diode mixer circuit according to one embodiment of the present invention, in which reference numeral 1 represents a source for producing RF signals on a frequency from 40 to 950 MHz, 2 a local source for producing signals of a frequency from 2050 to 2960 MHz, 3 an IF terminal for taking out IF signals of a frequency of 3000 MHz, $T_3$ a balanced transformer, $T_4$ a balanced hybrid ring, reference numerals 4 to 7 denote striplines extending to open end portions, $C_1$ to $C_4$ designate capacitors for passing RF signals, $R_1$ to $R_4$ designate resistors for applying biasing voltages, $L_1$ and $L_2$ represent coils for forming low-pass filters for the RF signals, and $C_5$ to $C_7$ designate capacitors for passing high frequency signals only. The elements having the same functions as those of FIG. 1 are denoted by the same symbols or numerals as those of FIG. 1.

Similarly to conventional mixer circuits, the RF signals and locally generated signals produced by the RF signal source 1 and the local signal source 2, respectively, are applied to the diodes $D_1$ to $D_4$ in a balanced manner through the balanced transformer $T_3$ and hybrid ring $T_4$, such that IF signals are obtained from the terminal 3.

In the mixer circuit of the present invention, the lengths of the striplines 4 to 7 are connected respectively to the anodes of diodes $D_1$ and $D_3$ and the cathodes of diodes $D_2$ and $D_4$ while the free ends are left open. The length of each stripline has been chosen to be slightly shorter than one-fourth of the wavelength of the 3000 MHz local signals so that the series circuits consisting of the lead inductances of diodes $D_1$ to $D_4$ and striplines 4 to 7 undergo series resonance at the IF frequency of 3000 MHz.

Therefore, the reactance when the diodes $D_1$ to $D_4$ are viewed from the terminals 8 and 9 acquires a value close to zero with respect to the IF frequency.

The striplines 4 to 7 exhibit good bypassing ability even for the locally generated signals of 2050 to 2960 MHz. The locally generated signals applied to the diodes $D_1$ to $D_4$ from the terminals 8 and 9 of the hybrid ring $T_4$ are desirably allowed to flow through striplines 4 to 7. Therefore, like the mixer of FIG. 1, voltages of a polarity indicated by (+) and (−) in the drawing are produced across the ends of each of the capacitors $C_1$ to $C_4$.

By adjusting the resistances of the resistors $R_1$ to $R_4$, therefore, it is possible to set biasing voltages for the diodes $D_1$ to $D_4$ such that the mixer circuit will exhibit optimum cross modulation characteristics and minimum conversion losses.

The balanced hybrid ring $T_4$ connected to the local signal source 1 is constructed based on a transmission path of a length related to the wavelength of the signals. Namely, the hybrid ring $T_4$ is so constructed that the distance between a point $P_1$ and a point $P_2$, the distance between the point $P_2$ and a point $P_3$, and the distance between the point $P_3$ and a point $P_4$ have a length equal to one-fourth of the wavelength, while the distance between the point $P_4$ and the point $P_1$ has the length equal to three-fourths of the wavelength, and the whole distance around the ring has a length of six-fourths of the wavelength.

It has been known that with the thus constructed hybrid ring $T_4$, the signals at the terminals 8 and 9 exhibit good anti-phase characteristics over a frequency range of about one-half an octave.

According to this above embodiment, the wavelength of the hybrid ring $T_4$ has been set to a wavelength of 2500 MHz which is nearly at the center of a range of frequencies 2050 to 2960 MHz of the locally generated signals. Therefore, the locally generated signals of 2050 to 2960 MHz are included in a frequency range of half an octave of the frequency 2500 MHz.

Hence, the locally generated signals are produced as good anti-phase signals at the terminals 8 and 9 of the hybrid ring $T_4$, and are applied to the diodes $D_1$ to $D_4$ via capacitors $C_5$ and $C_6$.

Coils $L_1$ and $L_2$ connected to the balanced transformer $T_3$ form low-pass filters with the help of the capacitances of the striplines 4 to 7 and resistors $R_1$ to $R_4$, and the stray capacitances present between the capacitors $C_1$ to $C_4$ and ground. The cut-off frequency of this embodiment has been set to be about 1500 MHz.

The RF signals are allowed to flow desirably through a path consisting of coil $L_1$, capacitor $C_1$, diode $D_1$, diode $D_2$, capacitor $C_2$, coil $L_2$, capacitor $C_3$, diode $D_3$, diode $D_4$, capacitor $C_4$ and coil $L_1$, without being reflected.

In the mixer circuit constructed according to the abovementioned embodiment of the present invention, the striplines 4 to 7 with their terminals open are provided for the anodes of diodes $D_1$ and $D_3$ and for the cathodes of diodes $D_2$ and $D_4$ so that the reactance of the circuit is remarkably reduced for the locally generated signals and the IF signals of the mixer circuit, and increased current flows through the capacitors $C_1$ to $C_4$ and diodes $D_1$ to $D_4$. Therefore, the biasing voltages for the diodes $D_1$ to $D_4$ may be set so that the mixer circuit exhibits optimum cross modulation characteristics, and that conversion losses and intermodulation characteristics are greatly improved.

Figure 3:
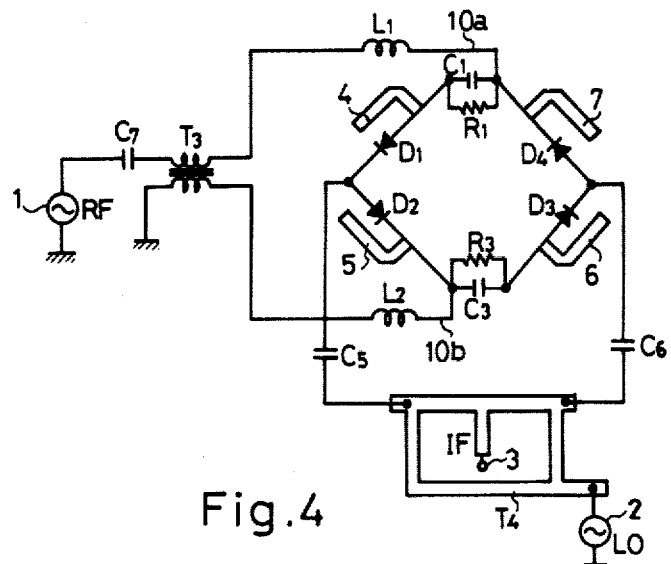
FIG. 3 is a circuit diagram showing a double-balanced mixer circuit according to another embodiment of the present invention.

FIG. 3 shows a mixer circuit according to another embodiment of the present invention. This embodiment is similar in most respects to the embodiment of FIG. 2 except that resistors $R_2$, $R_4$ and capacitors $C_2$, $D_4$ have been removed. The operation of this embodiment will be easily understood from the embodiment of FIG. 2, and is thus not mentioned here.

Figure 4:
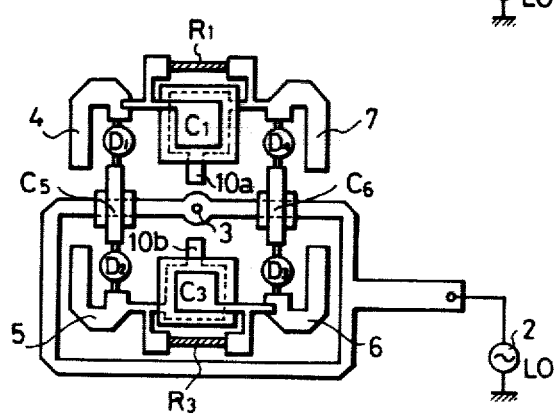
FIG. 4 is a diagram showing a pattern for the circuit of FIG. 3 when it is constructed by thick-film printing technology.

FIG. 4 is a diagram showing a pattern when the circuit of FIG. 3 is constructed by way of thick-film printing technology. When the mixer circuit constructed by the thick-film printing technology was used for a VHF-UHF all-band TV tuner shown in FIG. 5, such very good results as cross modulation characteristics of 105 to 110 dB V and conversion losses of 4 to 6 dB were obtained, and these could not be expected with the conventional mixer circuits.

Figure 5:
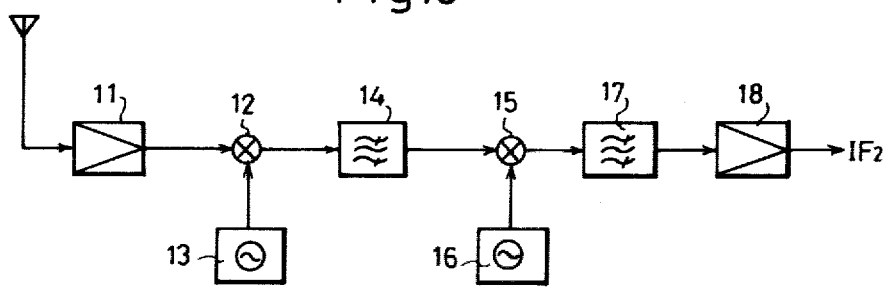
FIG. 5 is a block diagram of a VHF-UHF all-band TV tuner employing the mixer circuit shown in FIG. 2 or FIG. 3.

FIG. 5 is a block diagram of a VHF-UHF all-band TV tuner which converts RF singals of 54 to 890 MHz into a first IF frequency of 3000 MHz by means of a first mixer circuit and which further converts the Rf signals into a second IF frequency of 45.75 MHz by means of a second mixer circuit. Referring to FIG. 5, the TV tuner includes an RF amplifier circuit 11, a first mixer circuit 12, a first local generator circuit 13 of a frequency of 2114.75 to 2944.75 MHz, a band-pass filter 14 of 3000 MHz, a second mixer circuit 15, a second local generator circuit 16 of 3045.75 MHz, and band-pass filter 17 of 45.75 MHz, and an amplifier circuit 18 of 45.75 MHz.

According to the present invention as mentioned above, the provision of striplines with their terminals open enables the mixer circuit to exhibit greatly improved cross modulation characteristics, intermodulation characteristics, and reduced conversion losses. Moreover, the invention makes it possible to produce a mixer circuit of very small size with excellent ease, thereby providing important advantages in economy and practicability.

What is claimed is:

1. In a balanced mixer circuit including four diodes arranged generally in the form of a ring with junctions between adjacent diodes, a first balanced transformer connected to two of said junctions spaced oppositely across said ring from one another for supplying radio frequency signals to said mixer, a second balanced transformer connected to the two other of said junctions for supplying signals generated locally to said mixer, and an output leading from said second balanced transformer for providing an intermediate frequency signal, the improvement comprising means including four strip-lines each connected to a respective side of said ring for bypassing signals in the range of said intermediate frequency.

2. A balanced mixer circuit according to claim 1, said diode ring having first to fourth diodes, said first balanced transformer being connected to the junction between said first and fourth diodes and the junction between said second and third diodes, and said second balanced transformer being connected to the junction between said first and second diodes and the junction between said third and fourth diodes.

3. A balanced mixer circuit according to claim 2, further including parallel circuits each consisting of a capacitor and a resistor being connected in series with respective one of said diodes.

4. A balanced mixer circuit according to claim 3, said parallel circuits adjacent said first and third diodes being connected to the anodes thereof and the parallel circuits adjacent said second and fourth diodes being connected to the cathodes thereof.

5. A balanced mixer circuit according to claim 2, further including parallel circuits each consisting of a capacitor and a resistor being connected respectively between said first diode and said fourth diode, and between said second diode and said third diode.

6. A balanced mixer circuit according to claim 5, wherein said first balanced transformer is connected to the cathode of said fourth diode and the cathode of said second diode.

7. A balanced mixer circuit according to claim 1, said second balanced transformer being a hybrid ring.

8. A balanced mixer circuit according to claim 7, said hybrid ring comprising a first stripline having an intermediate frequency port at a mid point thereof, a second stripline connected to one end of said first stripline, and a third stripline connected between the other end of said first stripline and said second stripline.

9. A balanced mixer circuit according to claim 8, the lengths of said first, second and third striplines being respectively one-half, one-third and three-fourths of the wavelength of the frequency of said signal generated locally.

10. A balanced mixer circuit according to claim 1, including a coil forming a low-pass filter being inserted between said first balanced transformer and said diode ring.

11. A balanced mixer circuit according to claim 1, including a capacitor forming a high-pass filter being inserted between said second balanced transformer and said diode ring.

12. In a balanced mixer circuit including four diodes arranged generally in the form of a ring with junctions between adjacent diodes, a first balanced transformer connected to two of said junctions spaced oppositely across said ring from one another for supplying radio frequency signals to said mixer, a second balanced transformer connected to the two other of said junctions for supplying signals generated locally to said mixer, and an output leading from said second balanced transformer for providing an intermediate frequency signal, the improvement comprising four striplines each connected to a respective side of said ring for bypassing signals in the range of said intermediate frequency, the length of each of said striplines being predetermined to form series circuits each consisting of the inductances of the leads of the respective diodes and the respective stripline and adapted to resonate at a frequency in said range.

13. A balanced mixer circuit according to claim 12, wherein said series circuits resonate at an intermediate frequency.

14. A balanced mixer circuit according to claim 13, the length of said striplines being slightly shorter than one-fourth of the wavelength of said intermediate frequency.

15. A balanced mixer circuit according to claim 14, wherein the terminals of said striplines being opened.

* * * * *